United States Patent
Wu

(10) Patent No.: US 11,841,686 B2
(45) Date of Patent: Dec. 12, 2023

(54) INTEGRATED ENERGY-COLLECTING DISPLAY MODULE WITH CORE OUT

(71) Applicant: Garmin Switzerland GmbH, Schaffhausen (CH)

(72) Inventor: Wen-Yu Wu, New Taipei (TW)

(73) Assignee: Garmin Switzerland GmbH

( * ) Notice: Subject to any disclaimer, the term of this patent is extended or adjusted under 35 U.S.C. 154(b) by 355 days.

(21) Appl. No.: 17/092,932

(22) Filed: Nov. 9, 2020

(65) Prior Publication Data
US 2022/0146985 A1  May 12, 2022

(51) Int. Cl.
| | |
|---|---|
| *G04C 10/02* | (2006.01) |
| *G06F 1/16* | (2006.01) |
| *G02F 1/133* | (2006.01) |
| *G02F 1/1333* | (2006.01) |
| *H01L 31/032* | (2006.01) |
| *H10K 59/40* | (2023.01) |
| *H10K 59/60* | (2023.01) |
| *H01L 31/0352* | (2006.01) |

(52) U.S. Cl.
CPC ......... *G04C 10/02* (2013.01); *G02F 1/13306* (2013.01); *G02F 1/13324* (2021.01); *G02F 1/13338* (2013.01); *G06F 1/163* (2013.01); *G06F 1/1635* (2013.01); *H01L 31/032* (2013.01); *H01L 31/035281* (2013.01); *H10K 59/40* (2023.02); *H10K 59/60* (2023.02)

(58) Field of Classification Search
CPC . G04C 10/02; H01L 27/3227; G02F 1/13324; G02F 1/13338; G06F 1/163; H10K 59/40; H10K 59/60
See application file for complete search history.

(56) References Cited

U.S. PATENT DOCUMENTS

| | | | | |
|---|---|---|---|---|
| 4,927,721 | A * | 5/1990 | Gratzel | H01M 14/005 429/111 |
| 10,509,500 | B2 | 12/2019 | Lai et al. | |
| 10,770,608 | B2 | 9/2020 | Cardi et al. | |
| 10,884,272 | B2 | 1/2021 | Hanshew | |
| 2009/0108757 | A1* | 4/2009 | Lee | H01L 51/5281 315/51 |
| 2014/0152613 | A1* | 6/2014 | Ishizaki | G02F 1/134336 345/174 |
| 2016/0041414 | A1* | 2/2016 | Shen | G02F 1/13439 257/72 |
| 2020/0310356 | A1* | 10/2020 | Saito | G04C 10/02 |
| 2020/0319731 | A1 | 10/2020 | Yazdandoost et al. | |
| 2020/0343395 | A1 | 10/2020 | Cardi et al. | |
| 2021/0088820 | A1 | 3/2021 | Hanshew | |
| 2021/0233973 | A1* | 7/2021 | Han | H01L 27/3269 |

OTHER PUBLICATIONS

U.S. Appl. No. 16/947,879, filed Aug. 21, 2020.

* cited by examiner

*Primary Examiner* — Jessica M Merlin
(74) *Attorney, Agent, or Firm* — Samuel M. Korte; Max M. Ali

(57) ABSTRACT

Energy-collecting display modules are disclosed. The modules include a base substrate with a plurality of sub-pixels, which are laid out in a substantially regular sub-pixel pattern. The sub-pixels are dispersed along the base substrate with sub-pixel spacing regions between individual sub-pixels. The modules also include a photovoltaic region disposed within the sub-pixel spacing regions such that the photovoltaic region minimally obscures a subpixel viewing cone region.

20 Claims, 4 Drawing Sheets

INTEGRATED ENERGY-COLLECTING DISPLAY MODULE WITH CORE OUT

BACKGROUND

Conventional displays as used in bicycle computers, smart phones, smartwatches, GPS navigation devices, fitness trackers, etc. utilize display modules to provide a user interface to users of the electronic devices. These electronic devices may or may not employ a touchscreen. Where a touchscreen is not provided, buttons and other user input devices are used to receive user input. Battery life is important for these devices as it is aggravating for users to stop wearing a device for recharging. Some attempts have been made to equip smartwatches with semitransparent solar panels such as by using a discrete solar cell positioned on top of (or over) the watch's display. However, the presence of such a solar cell overlay degrades visibility of the display module. Accordingly, there is a need for an integrated energy-collecting display module that collects solar energy without substantially obscuring its display.

SUMMARY

Techniques are disclosed to enable an integrated energy-collecting display module comprising: a base substrate, a plurality of sub-pixels disposed upon the base substrate in a substantially regular sub-pixel pattern, wherein the plurality of sub-pixels is dispersed along the base substrate with sub-pixel spacing regions between individual sub-pixels within the plurality of sub-pixels, and a photovoltaic region disposed within the sub-pixel spacing regions, wherein the photovoltaic region minimally obscures a sub-pixel viewing cone region associated with each of the sub-pixels.

BRIEF DESCRIPTION OF THE DRAWINGS

The figures described below depict various aspects of the articles of manufacture disclosed herein. It is understood that these figures depict exemplary embodiments and particular aspects of the disclosed articles of manufacture. The exemplary features illustrated in the figures are intended to represent these aspects of the various disclosed embodiments and not intended to limit the claimed scope to any particular feature. Further, whenever possible, the following description refers to the reference numerals included in the figures, in which features depicted in multiple figures are designated with consistent reference numerals.

DETAILED DESCRIPTION

The following text sets forth a detailed description of numerous different embodiments. However, it is understood that the detailed description is to be construed as exemplary only and does not describe every possible embodiment since describing every possible embodiment would be impractical. In light of the teachings and disclosures herein, numerous alternative embodiments may be implemented.

It is understood that, unless a term is expressly defined in this patent application using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent application.

A single pixel on a color sub-pixelated display is made of several color primaries, typically three colored elements ordered (on various displays) either as blue, green, and red (BGR), or as red, green, and blue (RGB). Some displays have more than three primaries, often called MultiPrimary, such as the combination of red, green, blue, and yellow (RGBY), or red, green, blue and white (RGBW), or even red, green, blue, yellow, and cyan (RGBYC).

These pixel components, sometimes called sub-pixels, appear as a single color to the human eye because of blurring by the optics and spatial integration by nerve cells in the eye. The components are easily visible, however, when viewed with a small magnifying glass, such as a loupe. Over a certain resolution threshold the colors in the subpixels are not visible, but the relative intensity of the components shifts the apparent position or orientation of a line.

Figure 1A:
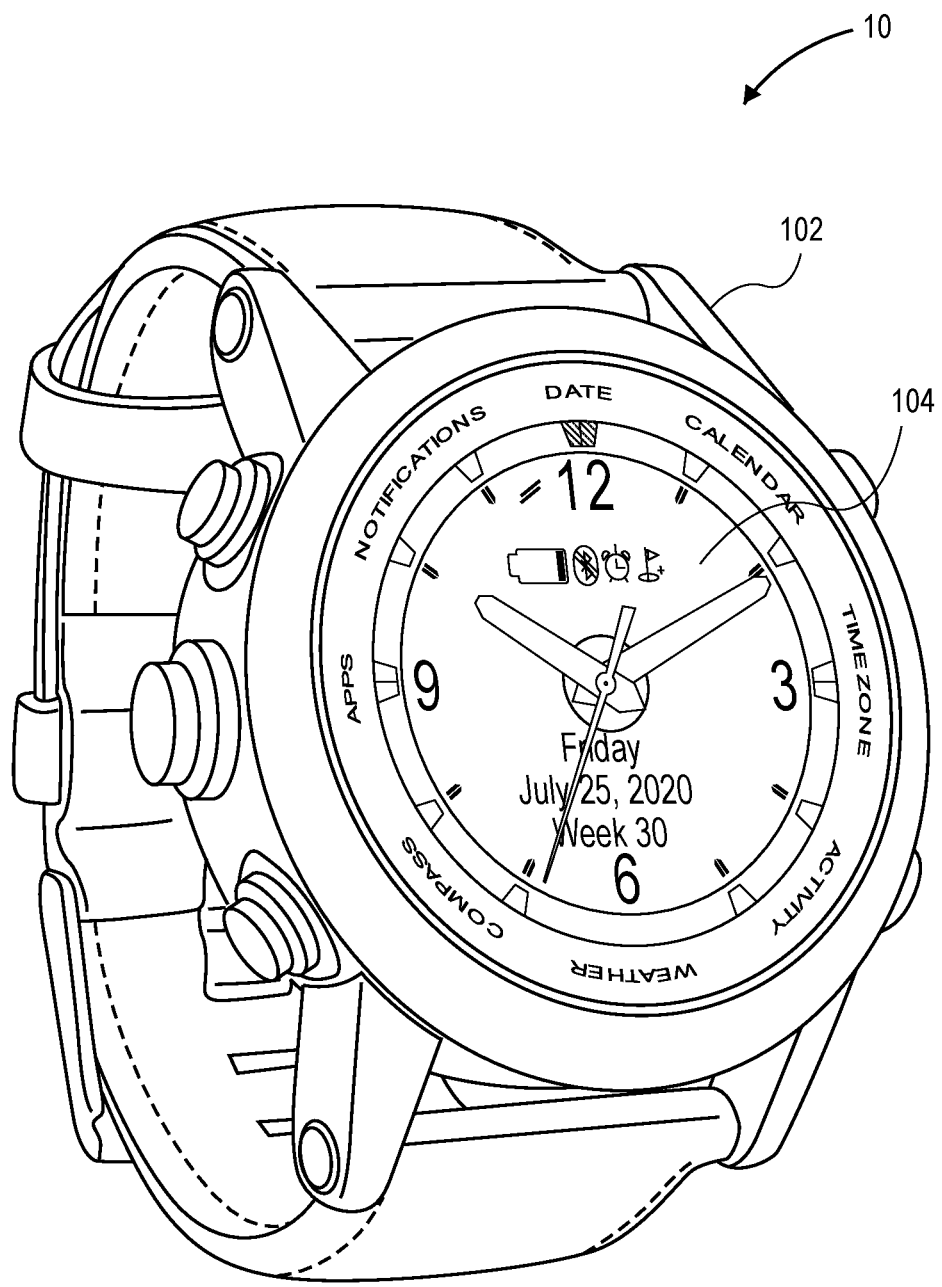
FIG. 1A is a plan view of a mobile electronic device (in this embodiment a watch 10) in accordance with one or more embodiments of the present disclosure.

FIG. 1A is a plan view of a mobile electronic device (in this embodiment a watch 10) in accordance with one or more embodiments of the present disclosure. In various embodiments, watch 10 is operable to provide user performance information and/or navigation functionality to a user of the watch 10. The watch 10 may be configured in a variety of ways. For instance, a watch 10 may be configured for use during fitness and/or sporting activities and comprise a smartwatch, a fitness tracker, a sport watch, a golf computer, a smart phone providing fitness or sporting applications (apps), a hand-held GPS device used for hiking, and so forth. However, it is contemplated that the present teachings can be implemented in connection with any mobile electronic device. Thus, the mobile electronic device may also be configured as a portable navigation device (PND), a mobile phone, a hand-held portable computer, a tablet computer, a personal digital assistant, a multimedia device, a media player, a game device, a bike computer and/or combinations thereof, and so forth. In the following description, a referenced component, such as mobile electronic device or specifically, watch 10, may refer to one or more entities, and therefore by convention reference may be made to a single entity (e.g., the watch 10) or multiple entities (e.g., the watches 10, the plurality of watches 10, and so on) using the same reference number.

The watch 10 includes a housing 102. The housing 102 is configured to house, e.g., substantially enclose, various components of the watch 10. The housing 102 may be formed from a lightweight and impact-resistant material such as metal or a metal alloy, plastic, nylon, or combinations thereof, for example. The housing 102 may be formed from a non-conductive material, such a non-metal material, for example. The housing 102 may include one or more gaskets, e.g., a seal, to make it substantially waterproof or water resistant. The housing 102 may include a location for a battery and/or another power source for powering one or more components of the watch 10. The housing 102 may be a singular piece or may include a plurality of sections. In embodiments, the housing 102 may be formed from a conductive material, such as metal, or a semi-conductive material.

In various embodiments, the watch 10 includes a viewing area 104. The viewing area 104 may include a liquid crystal display (LCD) or a display made up of organic light emitting diodes (OLED), active matrix organic light emitting diodes (AMOLED), micro light emitting diodes (microLED), thin film transistors (TFT), light-emitting diodes (LED), light-emitting polymer (LEP), and/or polymer light-emitting diodes (PLED). However, embodiments are not so limited. In various embodiments, the viewing area 104 includes one or more analog or mechanical presentation indicators, such as analog watch hands or mechanical complications or other mechanical gauge or dial indicators. In these embodiments, the viewing area 104 is used to display text and/or graphical information. The viewing area 104 may be backlit such that it may be viewed in the dark or other low-light environments. However, embodiments are not so limited. The viewing area 104 may be enclosed by a transparent lens or cover layer that covers and/or protects components of the watch 10. The viewing area 104 may be provided with a touch screen to receive input (e.g., data, commands, etc.) from a user. For example, a user may operate the watch 10 by touching the touch screen and/or by performing gestures on the screen. In some embodiments, the touch screen may be a capacitive touch screen, a resistive touch screen, an infrared touch screen, combinations thereof, and the like. The watch 10 may further include one or more input/output (I/O) devices (e.g., a keypad, buttons, a wireless input device, a thumbwheel input device, a track stick input device, and so on). The I/O devices may include one or more audio I/O devices, such as a microphone, speakers, and so on.

The watch 10 may also include a communication module representative of communication functionality to permit watch 10 to send/receive data between different devices (e.g., components/peripherals) and/or over the one or more networks. The communication module may be representative of a variety of communication components and functionality including, but not limited to: one or more antennas; a browser; a transmitter and/or receiver; a wireless radio; data ports; software interfaces and drivers; networking interfaces; data processing components; and so forth. The watch 10 may be configured to communicate via one or more networks with a cellular provider and an Internet provider to receive mobile phone service and various content, respectively. Content may represent a variety of different content, examples of which include, but are not limited to: map data, which may include route information; web pages; services; music; photographs; video; email service; instant messaging; device drivers; real-time and/or historical weather data; instruction updates; and so forth.

The one or more networks are representative of a variety of different communication pathways and network connections which may be employed, individually or in combinations, to communicate among various components. Thus, the one or more networks may be representative of communication pathways achieved using a single network or multiple networks. Further, the one or more networks are representative of a variety of different types of networks and connections that are contemplated including, but not limited to: the Internet; an intranet; a satellite network; a cellular network; a mobile data network; wired and/or wireless connections; and so forth. Examples of wireless networks include, but are not limited to: networks configured for communications according to: one or more standard of the Institute of Electrical and Electronics Engineers (IEEE), such as 802.11 or 802.16 (Wi-Max) standards; Wi-Fi standards promulgated by the Wi-Fi Alliance; Bluetooth standards promulgated by the Bluetooth Special Interest Group; and so on. Wired communications are also contemplated such as through universal serial bus (USB), Ethernet, serial connections, and so forth.

Functions of the watch 10 may be associated with a location determining component 142 (of FIG. 1B below). Functions of the watch 10 may include, but are not limited to, displaying a current geographic location of the watch 10, mapping a location in the viewing area 104, locating a desired location and displaying the desired location on the viewing area 104, monitoring a user's heart rate, monitoring a user's speed, monitoring a distance traveled, calculating calories burned, and the like. In embodiments, user input may be provided from movement of the housing 102. For example, an accelerometer may be used to identify tap inputs on the housing 102 or upward and/or sideways movements of the housing 102. In embodiments, user input may be provided from touch inputs identified using various touch sensing technologies, such as resistive touch or capacitive touch interfaces.

Figure 1B:
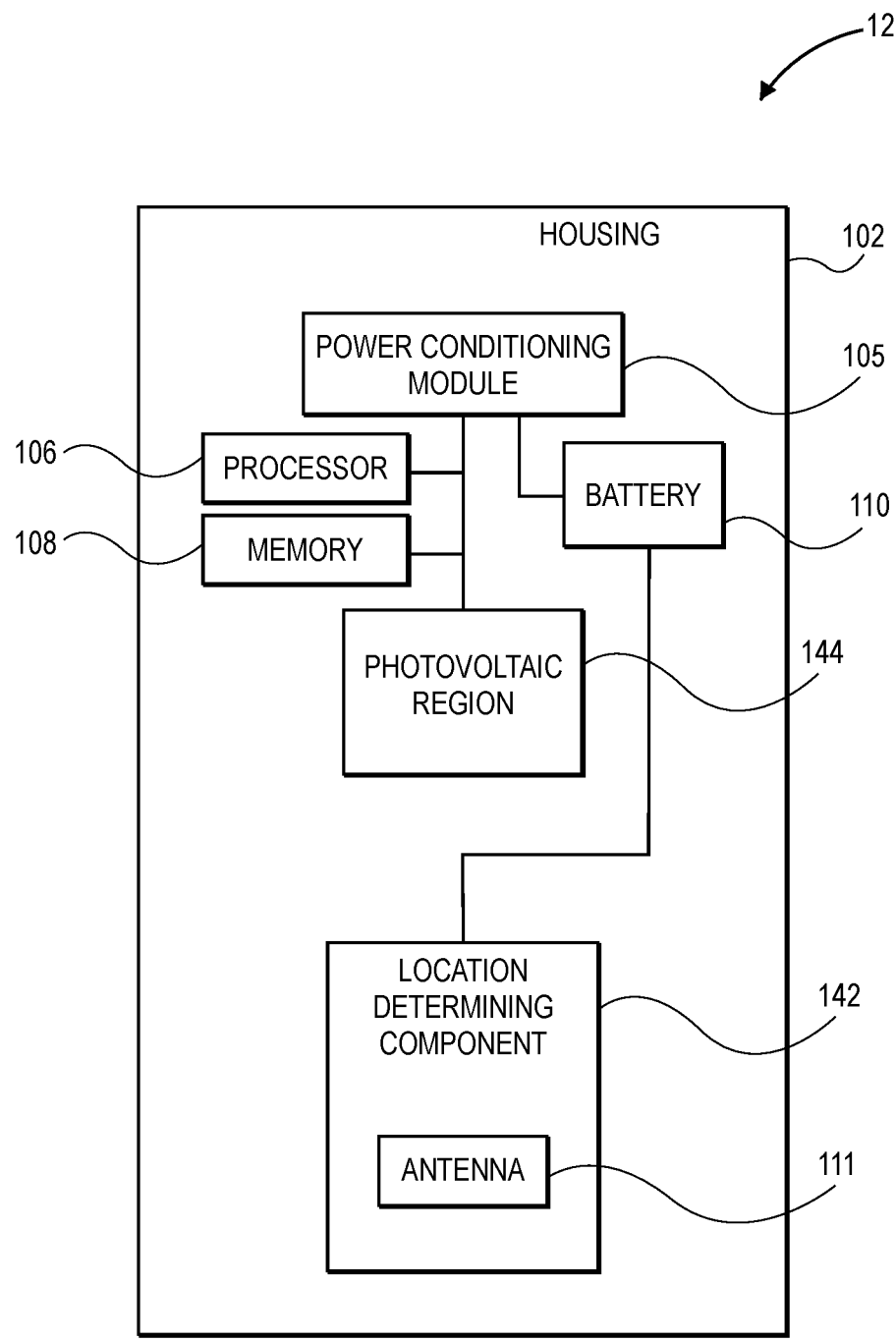
FIG. 1B is a block diagram of the internal components of an exemplary mobile electronic device such as the watch 10 of FIG. 1A, in accordance with various embodiments of the present disclosure.

FIG. 1B is a block diagram of the internal components 12 of an exemplary mobile electronic device such as the watch 10 of FIG. 1A, in accordance with various embodiments of the present disclosure. The components may include a location determining component 142 positioned within housing 102. For example, the location determining component 142 may include an antenna 111 having a ground plane. The ground plane may be formed by coupling a printed circuit board and/or a conductive cage with the antenna 111. The antenna 111 and the ground plane may be coupled using solder, connection elements, or combinations thereof.

The location determining component 142 may be a GPS receiver that is configured to provide geographic location information of the watch. The location determining component 142 may be, for example, a GPS receiver such as those provided in various products by GARMIN®. Generally, GPS is a satellite-based radio navigation system capable of determining continuous position, velocity, time, and direction information. Multiple users may simultaneously utilize GPS. GPS incorporates a plurality of GPS satellites that orbit the earth. Based on these orbits, GPS satellites can relay their location to a GPS receiver. For example, upon receiving a GPS signal, e.g., a radio signal, from a GPS satellite, the watch disclosed herein can determine a location of that satellite. The watch can continue scanning for GPS signals until it has acquired a number, e.g., at least three, of different GPS satellite signals. The watch may employ geometrical triangulation, e.g., where the watch utilizes the known GPS satellite positions to determine a position of the watch relative to the GPS satellites. Geographic location information and/or velocity information can be updated, e.g., in real time on a continuous basis, for the watch.

The location determining component 142 may also be configured to provide a variety of other position-determining functionality. Location determining functionality, for purposes of discussion herein, may relate to a variety of different navigation techniques and other techniques that may be supported by "knowing" one or more positions. For instance, location determining functionality may be employed to provide position/location information, timing information, speed information, and a variety of other navigation-related data. Accordingly, the location determining component 142 may be configured in a variety of ways to perform a wide variety of functions. For example, the location determining component 142 may be configured for outdoor navigation, vehicle navigation, aerial navigation (e.g., for airplanes, helicopters), marine navigation, personal use (e.g., as a part of fitness-related equipment), and so forth. Accordingly, the location determining component 142 may include a variety of devices to determine position using one or more of the techniques previously described.

The location determining component 142, for instance, may use signal data received via a GPS receiver in combination with map data that is stored in the memory to generate navigation instructions (e.g., turn-by-turn instructions to an input destination or point of interest), show a current position on a map, and so on. Location determining component 142 may include one or more antennas 111 to receive signal data as well as to perform other communications, such as communication via one or more networks. The location determining component 142 may also provide other positioning functionality, such as to determine an average speed, calculate an arrival time, and so on.

The components 12 may include one or more processors, controllers, and/or other computing devices as well as a memory 108, e.g., for storing information accessed and/or generated by the processors or other computing devices. The processor 106 may be electrically coupled with a printed circuit board and operable to process position determining signals received by the antenna 111. The location determining component 142, via the antenna 111, is configured to receive position determining signals, such as GPS signals from GPS satellites, to determine a current geographic location of the watch 10. The location determining component 142 may also be configured to calculate a route to a desired location, provide instructions, e.g., directions, to navigate to the desired location, display maps and other information on the display, and to execute other functions, such as, but not limited to, those functions described herein.

The memory 108 may store cartographic data and routing used by or generated by the location determining component 142. The memory may be integral with the location determining component 142, stand-alone memory, or a combination of both. The memory 108 may include, for example, a removable nonvolatile memory card, such as a TransFlash card. The memory is an example of device-readable storage media that provides storage functionality to store various data associated with the operation of the watch 10, such as the software program and code segments mentioned above, or other data to instruct the processor and other elements of the watch 10 to perform the techniques described herein. A wide variety of types and combinations of memory may be employed. The memory may be integral with the processor, stand-alone memory, or a combination of both. The memory may include, for example, removable and non-removable memory elements such as RAM, ROM, Flash (e.g., SD Card, mini-SD card, micro-SD Card), magnetic, optical, USB memory devices, and so forth.

Antenna 111, for example, may be configured to receive and/or transmit a signal, such as a GPS signal. Antenna 111 may be any antenna capable of receiving wireless signals from a remote source, including directional antennas and omnidirectional antennas. Antenna 111 may include any type of antennas in which the length of the ground plane affects the efficiency of the antenna. In accordance with one or more embodiments of the present disclosure, the antenna 111 is an omnidirectional antenna having a ground plane. An omnidirectional antenna may receive and/or transmit in both orthogonal polarizations, depending upon direction. In other words, omnidirectional antennas do not have a predominant direction of reception and/or transmission. Examples of omnidirectional antennas include, but are not limited to, inverted-F antennas (IFAs) and planar inverted-F antennas (PIFAs). In contrast to omnidirectional antennas, directional antennas have a primary lobe of reception and/or transmission over an approximate 70 by 70 degree sector in a direction away from the ground plane. Examples of directional antennas include, but are not limited to, microstrip antennas and patch antennas.

In accordance with one or more embodiments of the present disclosure, the antenna 111 may be an embedded antenna. As used herein, an embedded antenna refers to an antenna that is positioned completely within a device housing. For example, the antenna 111 may be positioned completely within the housing 102. In some embodiments, the antenna 111 may be an external antenna with all or a portion of the antenna 111 exposed from the housing 102.

As discussed, the location determining component 142 includes the antenna 111. The antenna 111 may be associated with, e.g., formed on and/or within, an antenna support assembly. Alternatively, the antenna 111 may be positioned on a top portion or one or more side portions of the antenna support assembly.

The printed circuit board may support a number of processors (such as processor 106), microprocessors, controllers, microcontrollers, programmable intelligent computers (PIC), field-programmable gate arrays (FPGA), other processing components, other field logic devices, application specific integrated circuits (ASIC), and/or a memory that is configured to access and/or store information that is received or generated by the watch. The watch 10 may implement one or more software programs to control text and/or graphical information on the display, as discussed herein. As an example, the printed circuit board may support the bottom portion of the antenna support assembly. In some embodiments, the antenna support assembly and antenna 111 may be positioned in the center of the top surface, bottom surface, or to a side of the of the printed circuit board.

The processor 106 may provide processing functionality for the watch 10 and may include any number of processors, micro-controllers, or other processing systems, and resident or external memory for storing data and other information accessed or generated by the watch 10. The processor may execute one or more software programs that implement the techniques and modules described herein. The processor is not limited by the materials from which it is formed or the processing mechanisms employed therein and, as such, may be implemented via semiconductor(s) and/or transistors (e.g., electronic integrated circuits (ICs)), and so forth.

In accordance with one or more embodiments of the present disclosure, functions of the portable electronic device may be associated with the location determining component 142 and/or an associated performance monitoring component (not shown). For example, the location determining component 142 is configured to receive signals, e.g. position determining signals, such as GPS signals, to determine a position of the watch as a function of the signals. The location determining component 142 may also be configured to calculate a route to a desired location, provide instructions to navigate to the desired location, display maps and/or other information in the viewing area 104, to execute other functions described herein, among other things.

The performance monitoring component may be positioned within the housing 102 and be coupled to the location determining component 142 and the viewing area 104 of FIG. 1A. The performance monitoring component may receive information, including, but not limited to geographic location information, from the location determining component 142, to perform a function, such as monitoring performance and/or calculating performance values and/or information related to a watch user's movement, e.g., exercise. The monitoring of the performance and/or the calculating performance values may be based at least in part on the geographic location information. The performance values may include, for example, a user's heart rate, speed, a total distance traveled, total distance goals, speed goals, pace, cadence, and calories burned. These values and/or information may be presented in the viewing area 104.

In embodiments, the watch 10 includes a user interface, which is storable in memory and executable by the processor. The user interface is representative of functionality to control the display of information and data to the user of the watch 10 in the viewing area 104. In some implementations, a display module within the viewing area 104 may not be integrated into the smartwatch and may instead be connected externally using universal serial bus (USB), Ethernet, serial connections, and so forth. The user interface may provide functionality to allow the user to interact with one or more applications of the watch 10 by providing inputs via the touch screen and/or the I/O devices. For example, the user interface may cause an application programming interface (API) to be generated to expose functionality to an application to configure the application for display in the viewing area 104 or in combination with another display. In embodiments, the API may further expose functionality to configure the application to allow the user to interact with an application by providing inputs via the touch screen and/or the I/O devices. Applications may comprise software, which is storable in memory and executable by the processor, to perform a specific operation or group of operations to furnish functionality to the watch 10. Example applications may include fitness application, exercise applications, health applications, diet applications, cellular telephone applications, instant messaging applications, email applications, photograph sharing applications, calendar applications, address book applications, and so forth.

In various embodiments, the user interface may include a browser (not shown). The browser enables the watch 10 to display and interact with content such as a webpage within the World Wide Web, a webpage provided by a web server in a private network, and so forth. The browser may be configured in a variety of ways. For example, the browser may be configured as an application accessed by the user interface. The browser may be a web browser suitable for use by a full resource device with substantial memory and processor resources (e.g., a smart phone, a personal digital assistant (PDA), etc.). However, in one or more implementations, the browser may be a mobile browser suitable for use by a low-resource device with limited memory and/or processing resources (e.g., a mobile telephone, a portable music device, a transportable entertainment device, etc.). Such mobile browsers typically conserve battery energy, memory and processor resources, but may offer fewer browser functions than web browsers.

In various embodiments, the watch 10 includes an energy storage device such as a battery 110. It is understood that this energy storage device could employ any conventional or later developed energy storage or chemical battery technology, such as a supercapacitor, for example employing electrostatic double-layer capacitance and electrochemical pseudocapacitance. In various embodiments the energy storage device or battery 110 includes a lithium polymer battery. In various embodiments, photovoltaic region 144 collects and converts light into energy that conditioned by power conditioning module 105 and stored in the battery 110.

Figure 2:
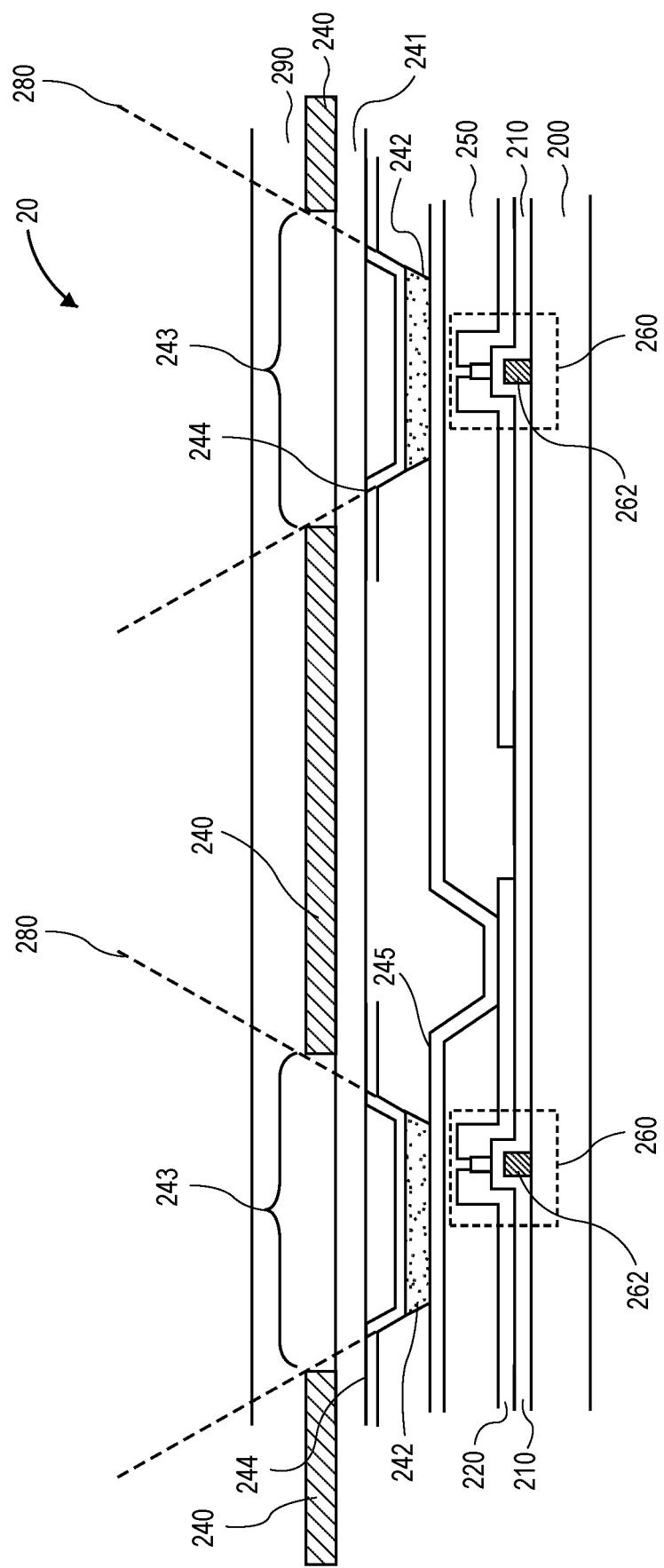
FIG. 2 illustrates the various layers of an energy-collecting display module 20 in accordance with various embodiments of the present disclosure.

FIG. 2 illustrates the various layers of an energy-collecting display module 20 in accordance with various embodiments of the present disclosure. In various embodiments, a thin, substantially transparent lens or cover layer is provided (not shown). A viewing area within the display module 20 can be observed through the cover layer, while the cover layer protects the display module 20 from physical damage. Moreover, in various embodiments extremely robust, scratch-resistant, and substantially transparent materials are employed, such as sapphire glass which is a synthetically produced crystal that is well-suited for use in touchscreens. In various alternate embodiments, the cover layer 302 is made of Gorilla Glass™ from Corning Incorporated from Corning, New York.

In various embodiments, a base substrate 200 is provided onto which various additional layers are disposed or applied. In various embodiments, a transistor 260 is provided in order to energize sub-pixels of the display module 20. Layer 210 is provided in order to insulate gate 262 (of the transistor 260) from the base substrate 200. In various embodiments, semiconductor layer 220 is provided to implement a source and drain of the transistor 260. In an embodiment, the isolation layer 250 provides spacing between the transistors 260 and subcomponents associated with the sub-pixels of the display module 20, which sub-pixels are dispersed atop the base substrate 200. In various embodiments, the upper substrate 290 provides a seal or protective layer to associated subcomponents of the display module 20.

In various embodiments, the sub-pixels are made up of an organic electroluminescent material such as organic material 242. The organic material 242 is disposed between two electrodes, anode 244 and cathode 245. In various embodiments, the organic material 242 is electrically conductive as a result of delocalization of pi electrons caused by conjugation over part or all of molecules associated with the material. In various embodiments, the photovoltaic material 240, is disposed within the display module 20 such that light is able to pass through the face of the watch 10 or other portable electronic device and generate photovoltaic energy in the photovoltaic material 240. In an embodiment the photovoltaic material 240 is isolated from the electrode(s) by photovoltaic insulating layer 241. In various embodiments, the photovoltaic material 240 is formed from one or more layers of doped amorphous silicon which has the advantages of low cost as well as low toxicity compared to some other photovoltaic materials, but it is understood that other photovoltaic materials may be employed without departing from the present teachings such as silicon, microcrystalline silicon, perovskite, or combinations thereof, e.g., stacked in layers. In various embodiments a pattern associated with the photovoltaic material 240 is formed by first depositing a substantially uniform layer or layers of photovoltaic material and then removing desired portions of the material by way of photoetching. In some embodiments, the pattern of the photovoltaic material 240 is spaced in such a way as not to obscure the display by blocking any light being emitted by a sub-pixel. The spaces or regions between the individual sub-pixels are referred to herein as sub-pixel spacing regions, which are further described in connection with FIG. 3 below. In some embodiments, the photovoltaic material is arranged in such a manner as to occupy substantially all of the space in the sub-pixel spacing regions. In some embodiments additional photovoltaic material 240 is cored-out or removed by, for example, photoetching so that sub-pixel viewing cones 280 are not obscured by the photovoltaic material 240.

In some embodiments, as shown in FIG. 2, photovoltaic material 240 is disposed on photovoltaic insulating layer 241. In these embodiments, upper substrate 290 protects the photovoltaic material 240 and the rest of the display module 20. In alternative embodiments, the photovoltaic material may be disposed on the top surface of the upper substrate 290 thereby obviating any need for photovoltaic insulating layer 241. In yet alternative embodiments, the photovoltaic material 240 may be disposed on the bottom surface of top substrate 290 spaced above and electrically isolated from conductive anode 244, with or without photovoltaic insulating layer 241. In further alternative embodiments, photovoltaic material 240 and photovoltaic insulating layer 241 may be disposed directly on cathode layer 245 at the same level as the subpixels so that less photovoltaic material must be additionally cored out to prevent blocking light associated with sub-pixel viewing cones 280.

In various embodiments, photovoltaic energy is transmitted through the display module 20 into the photovoltaic layer made up of photovoltaic material 240 thus generating electrical current and, therefore, energy in the photovoltaic layer which is then collected by way of conductors, eventually through power conditioning module 105 and into the battery 110 of FIG. 1B. In various embodiments, the sub-pixels are AMOLED subpixels. In some embodiments, a number of touch sensors are provided by way of touch sensor traces (not shown), which may take the form of a capacitive touch panel ("CTP") made of a transparent conductive material such as indium tin oxide ("ITO") patterned in an array upon the display module 20. In various embodiments, touch or gesture signals received at the touch sensor traces are further processed to provide input to the watch 10.

Figure 3:
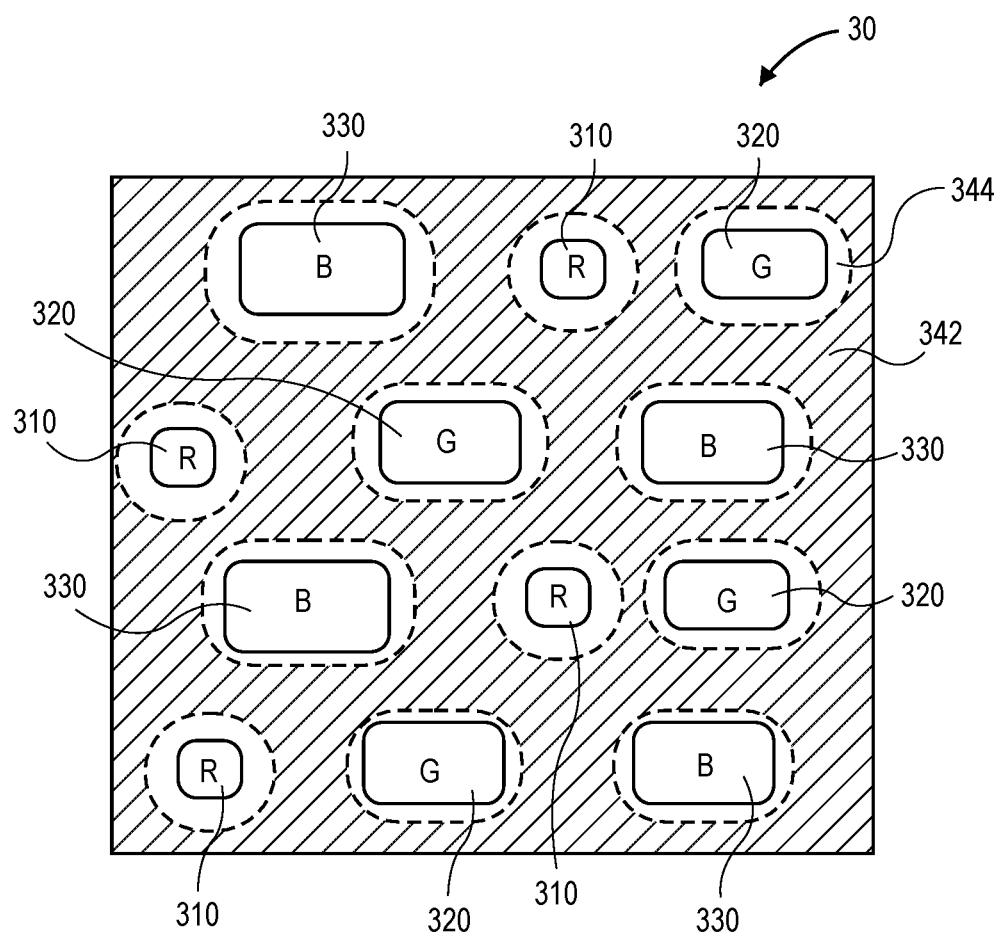
FIG. 3 illustrates a cluster of illustrative pixels made up of individual sub-pixels having photovoltaic regions disposed therebetween, in accordance with various embodiments of the present disclosure.

FIG. 3 illustrates a cluster of illustrative pixels 30 made up of individual sub-pixels having photovoltaic regions disposed therebetween, in accordance with various embodiments of the present disclosure. In various embodiments, these sub-pixels having their respective colors are combined to provide a pixel which color can be arbitrarily controlled to result in a pixel of a particular color. It is understood that a relatively large array of regularly-spaced, individually controlled pixels forming a regular pattern can render an arbitrary image. In an embodiment, such pixels are made up of red pixels 310, green pixels 320, and blue pixels 330. In various embodiments, photovoltaic material is placed between the sub-pixels in sub-pixel spacing regions 342 as illustrated in FIG. 3. In various embodiments, the sub-pixel spacing regions are the regions located between each of the colored sub-pixels 310, 320, and 330 that make up the individual pixels. In various embodiments, this photovoltaic material takes the form of photovoltaic strips which are positioned in the sub-pixel spacing regions 342. In some embodiments, the photovoltaic strips are substantially linear and do not take up the entire area of the sub-pixel spacing regions 342. In some alternative embodiments, photovoltaic material in the sub-pixel spacing regions 342 may take up and cover substantially more of the sub-pixel spacing regions 342 as shown in FIG. 3. In some embodiments, additional photovoltaic material is removed to allow light from the sub-pixel viewing cone 280 to be emitted as described above in connection with FIG. 2. The resulting bare regions 344 resulting from the additional removal or absence of photovoltaic material allow for maximal coverage of photovoltaic material while still permitting light from the sub-pixel viewing cone to be emitted.

Although the foregoing text sets forth a detailed description of numerous different embodiments, it is understood that the detailed description is to be construed as exemplary only and does not describe every possible embodiment because describing every possible embodiment would be impractical, if not impossible. In light of the foregoing text, numerous alternative embodiments may be implemented, using either current technology or technology developed after the filing date of this patent application.

What is claimed is:

1. An integrated energy-collecting display module comprising:
   a base substrate;
   a plurality of sub-pixels disposed upon the base substrate in a substantially regular sub-pixel pattern, wherein the plurality of sub-pixels is dispersed along the base substrate with sub-pixel spacing regions between individual sub-pixels within the plurality of sub-pixels; and
   a photovoltaic region disposed within the sub-pixel spacing regions, wherein the photovoltaic region minimally obscures a sub-pixel viewing cone region associated with each of the sub-pixels, wherein the sub-pixel viewing cone region associated with each of the sub-pixels extends outwards from each sub-pixel and through a gap within the photovoltaic region, each gap within the photovoltaic region having a width greater than the width of the associated sub-pixel.

2. The display module of claim 1, wherein the display module is liquid crystal display.

3. The display module of claim 2 further comprising a backlight.

4. The display module of claim 1, wherein a sub-pixel in the plurality of sub-pixels comprises an organic electroluminescent material.

5. The display module of claim 1, wherein the photovoltaic region comprises at least one layer of silicon.

6. The display module of claim 5, wherein the photovoltaic region comprises at least one layer of perovskite.

7. The display module of claim 1, further comprising:
   a touch sensor disposed above the base substrate.

8. The display module of claim 7, wherein the touch sensor comprises capacitive touch traces comprising an indium tin oxide array.

9. The display module of claim 8, wherein the display module is integrated into a wearable portable electronic device.

10. An integrated energy-collecting display module comprising:
    a base substrate;
    a plurality of organic electroluminescent sub-pixels disposed upon the base substrate in a substantially regular sub-pixel pattern, wherein the plurality of sub-pixels is dispersed along the base substrate with sub-pixel spacing regions between individual sub-pixels within the plurality of sub-pixels, the sub-pixels comprising:
       a cathode;
       an anode; and
       at least one sub-pixel energizer,
    a top substrate disposed opposite to and above the base substrate; and
    a photovoltaic region disposed within the sub-pixel spacing regions, wherein the photovoltaic region minimally obscures a sub-pixel viewing cone region associated with each of the sub-pixels, wherein the sub-pixel viewing cone region associated with each of the sub-pixels extends outwards from each sub-pixel and through a gap within the photovoltaic region, each gap within the photovoltaic region having a width greater than the width of the associated sub-pixel.

11. The display module of claim 10, wherein the anode comprises indium tin oxide.

12. The display module of claim 10, wherein the plurality of organic electroluminescent sub-pixels comprises red, green, and blue sub-pixels.

13. The display module of claim 10, wherein the sub-pixel energizer comprises a thin-film transistor backplane.

14. The display module of claim 10, wherein the photovoltaic region comprises at least one layer of silicon and at least one layer of perovskite.

15. The display module of claim 10, further comprising:
a touch sensor disposed between the base substrate and the top substrate within the sub-pixel spacing regions.

16. The display module of claim 15, wherein the touch sensor comprises capacitive touch traces comprising an indium tin oxide array.

17. An integrated energy-collecting display module comprising:
a base substrate;
a plurality of organic electroluminescent sub-pixels disposed upon the base substrate in a substantially regular sub-pixel pattern, wherein the plurality of sub-pixels is dispersed along the base substrate with sub-pixel spacing regions between individual sub-pixels within the plurality of sub-pixels, the sub-pixels comprising:
a cathode layer;
an indium tin oxide anode layer; and
a plurality of thin-film transistor sub-pixel controllers,
a top substrate disposed opposite to and above the base substrate; and
a photovoltaic region disposed within the sub-pixel spacing regions, wherein the photovoltaic region minimally obscures a sub-pixel viewing cone region associated with each of the sub-pixels, wherein the sub-pixel viewing cone region associated with each of the sub-pixels extends outwards from each sub-pixel and through a gap within the photovoltaic region, each gap within the photovoltaic region having a width greater than the width of the associated sub-pixel.

18. The display module of claim 17, wherein the photovoltaic region comprises at least one layer of a semiconductive material.

19. The display module of claim 17, further comprising:
a touch sensor disposed between the base substrate and the top substrate within the sub-pixel spacing regions.

20. The display module of claim 19, wherein the touch sensor comprises capacitive touch traces comprising an indium tin oxide array.

* * * * *